United States Patent
Friebe

(10) Patent No.: US 10,151,776 B2
(45) Date of Patent: Dec. 11, 2018

(54) METHOD AND DEVICE FOR MONITORING AND MEASURING A CURRENT ON A MAGNETICALLY BIASED CHOKE

(71) Applicant: SMA Solar Technology AG, Niestetal (DE)

(72) Inventor: Jens Friebe, Vellmar (DE)

(73) Assignee: SMA Solar Technology AG, Niestetal (DE)

(*) Notice: Subject to any disclaimer, the term of this patent is extended or adjusted under 35 U.S.C. 154(b) by 329 days.

(21) Appl. No.: 14/925,018

(22) Filed: Oct. 28, 2015

(65) Prior Publication Data

US 2016/0047845 A1 Feb. 18, 2016

Related U.S. Application Data

(63) Continuation of application No. PCT/EP2014/058682, filed on Apr. 29, 2014.

(51) Int. Cl.
| | |
|---|---|
| *G01R 15/14* | (2006.01) |
| *H01F 21/08* | (2006.01) |
| *H01F 27/26* | (2006.01) |
| *G01R 33/07* | (2006.01) |
| *G01R 33/02* | (2006.01) |

(52) U.S. Cl.
CPC ......... *G01R 15/148* (2013.01); *G01R 33/072* (2013.01); *H01F 21/08* (2013.01); *H01F 27/26* (2013.01); *G01R 33/02* (2013.01)

(58) Field of Classification Search
CPC .............................. G01R 33/02; G01R 15/148
USPC ........................................................... 324/251
See application file for complete search history.

(56) References Cited

U.S. PATENT DOCUMENTS

| | | | | |
|---|---|---|---|---|
| 3,671,810 A | * | 6/1972 | Barnes | H01F 29/146 307/401 |
| 3,968,465 A | * | 7/1976 | Fukui | G01B 13/06 336/110 |
| 2013/0099779 A1 | | 4/2013 | Holman, Jr. | |
| 2013/0335178 A1 | | 12/2013 | Viotto et al. | |

FOREIGN PATENT DOCUMENTS

| | | |
|---|---|---|
| CN | 2876787 Y | 3/2007 |
| DE | 10317215 A1 | 11/2004 |
| DE | 102010062237 A1 | 6/2012 |
| EP | 0006565 A1 | 1/1980 |
| JP | 62163974 A | 7/1987 |
| WO | 2011029018 A2 | 3/2011 |

* cited by examiner

*Primary Examiner* — Reena Aurora
(74) *Attorney, Agent, or Firm* — Eschweiler & Potashnik, LLC

(57) ABSTRACT

In order to measure a choke current through a choke, a flux density of a magnetic field which is emitted by the choke is consecutively measured at a sampling rate at a location which is fixed in relation to the choke. A magnetic bias of the choke is ascertained from the measurement values of the flux density at a known choke current which occurs during operation of the choke, wherein the choke current is known only in longer time intervals than the inverse value of the sampling rate during measurement of the flux density. The actual choke current is determined from the actual measurement values of the flux density taking into account the ascertained magnetic bias.

20 Claims, 2 Drawing Sheets

METHOD AND DEVICE FOR MONITORING AND MEASURING A CURRENT ON A MAGNETICALLY BIASED CHOKE

CROSS REFERENCE TO RELATED APPLICATIONS

This application claims priority to International Patent Application number PCT/EP2014/058682, filed on Apr. 29, 2014, which claims priority to German Patent Application number 10 2013 104 402.6, filed on Apr. 30, 2013, and is hereby incorporated by reference in its entirety.

FIELD

The disclosure relates to a method for measuring a choke current through a choke, and a device comprising a choke.

BACKGROUND

CN 2876787 Y discloses a method for measuring a choke current. Specifically, the document relates to a current sensor for measuring a current through a conductor. The conductor is wound onto a C-shaped core, a Hall sensor which is mounted on a printed circuit board being arranged in the air gap in the C-shaped core. The current through the conductor magnetizes the core. The magnetic flux through the core continues through the Hall sensor on the printed circuit board. The voltage which is generated by the magnetic field or by the magnetic flux density of the magnetic field in the Hall sensor is a measure of the magnetic flux density and therefore of the current through the conductor.

WO 2011/029018 A2 discloses measurement of the current through a power line. To this end, the power line is surrounded by a C-shaped core onto which a compensation coil is wound and in the air gap of which a Hall sensor is arranged. A compensation current through the coil is regulated in such a way that the magnetic flux which is induced in the core by the current through the power line and detected by the Hall sensor disappears. The compensation current which is regulated in such a way is a direct measure of the current flowing in the power line.

DE 103 17 215 A1 discloses a method for determining the quality of permanent magnets. The permanent magnet is moved relative to a receiving sensor. In the process, the actual magnetization is ascertained in the form of a field strength curve. Any fault in the permanent magnet in its operating range is determined by comparing the field strength curve with an ideal curve.

DE 10 2011 000 980 A1 discloses a choke with dynamic premagnetization. The choke has a choke winding, a core, a permanent magnet for premagnetizing the core, and a magnetization device for setting the desired magnetization of the permanent magnet. The magnetization device can be used to match the premagnetization of the core to the operating conditions of the choke. A magnetization detection device which detects the magnetization of the permanent magnet of the choke is also provided. This magnetization detection apparatus monitors the time profile of a choke current through the choke winding for signs of undesired saturation of the core. It is therefore possible to establish whether the magnetization of the permanent magnet has decreased or is no longer suitable for other reasons.

The typical objective of a magnetic bias of a choke is to extend the active operating range of the choke, in which magnetic saturation of the core of the choke does not occur, for a choke current which flows only in one direction.

DE 10 2010 062 237 A1 discloses a method for calibrating a magnetic field sensor with a permanent magnet. The method comprises applying a first magnetic field with a first strength to the magnetic field sensor and reading out a first response voltage, and also applying a second magnetic field with a second strength to the magnetic field sensor and reading out a second response voltage. Furthermore, the sensitivity of the magnetic field sensor is ascertained on the basis of the difference between the first and the second magnetic field strength and the difference between the first and the second response voltage. The useful field strength of the permanent magnet is then ascertained on the basis of the ascertained sensitivity. In this way, the useful field strength of the permanent magnet is determined during operation of the magnetic field sensor. For a coil, the generated magnetic field is proportional to the current in the coil. Therefore, it is possible to deduce the useful field strength of the permanent magnet by means of a change in the current in the coil and the response voltages which are measured in the process.

JP S62-163974 A discloses a current sensor in which an offset voltage of a Hall element is compensated by means which generate a magnetic auxiliary field. These means comprise an auxiliary coil. At a current, which is to be measured, of zero, the current flowing through the auxiliary coil is set such that the offset voltage is changed to zero.

SUMMARY

In a method according to the disclosure for measuring a choke current through a choke, a flux density of a magnetic field which is emitted by the choke is consecutively measured at a sampling rate at a location which is fixed in relation to the choke. A magnetic bias of the choke is ascertained from the measurement values of the flux density at a known choke current which occurs during use of the choke, wherein the choke current (I) is known only in longer time intervals than the inverse value of the sampling rate during measurement of the flux density (B). The actual choke current (i.e., initially unknown) is determined from the actual measurement values of the flux density taking into account the ascertained magnetic bias. The measurements of the flux density therefore have a twin purpose, specifically of detecting and therefore also of monitoring the magnetic bias of the choke on the one hand and of measuring the actual choke current through the choke on the other. The measurement values of the flux density of the magnetic field which is emitted by the choke depend on both factors, that is to say the magnetic bias and the actual choke current. However, the magnetic bias can be assumed to be constant in principle, that is to say at least for certain time periods without the occurrence of particular events. Therefore, the magnetic bias can be determined at points under the boundary condition of a known choke current and then taken into account when, as a result, the actual choke current is ascertained from the actual measurement values of the flux density.

Specifically, the magnetic bias of the choke can be ascertained from the measurement values of the flux density at the known choke current in time intervals which are longer by at least a factor of 10 than the time intervals in which the choke current is determined from the actual measurement values of the flux density taking into account the ascertained magnetic bias. Often, even much longer time intervals are sufficient to ascertain the magnetic bias of the choke from the measurement values of the flux density at the known choke current. The minimum intervals in which the bias of the choke can be ascertained from the measurement values of the flux density at the known choke current depend on when the choke current is known. The minimum intervals in which the choke current can be determined from the actual measurement values of the flux density taking into account the ascertained magnetic bias are equal to the inverse value of the sampling rate at which the flux density of the magnetic field which is emitted by the choke is consecutively measured.

It goes without saying that, when determining the magnetic bias in the manner according to the disclosure, it is not important to determine an absolute value of the magnetization, which is produced as a result, of a core of the choke. Instead, it is sufficient to determine the effect of the magnetic bias on the flux density of the magnetic field, which is emitted by the choke, at the location which is fixed in relation to the choke. It is likewise sufficient when ascertaining the choke current from the actual measurement values of the flux density to take into account this effect of the magnetic bias as an offset of a signal component, which is produced solely by the choke current, at the location of the measurement. However, in one embodiment care should be taken here that the flux density of the magnetic field which is generated by the choke at the location of the measurement, that is to say the stray field of the choke, decreases as the distance from the choke increases and, in this case, also depending on the direction of the distance. Therefore, the offset which is produced by the magnetic bias, like the signal component which is produced solely by the choke current, is dependent on the location of the measurement.

In one embodiment the choke current through the choke, which has to be known in order to ascertain the magnetic bias of the choke, can be directly measured in the method according to the disclosure. However, this can be done with a much lower level of expenditure than measurement of the magnetic flux density for measuring the actual choke current. In particular, the additional direct measurement of the choke current can be performed at a sampling rate which is lower by at least a factor of 10 than during the measurement of the magnetic flux density. In addition, absolute accuracy with which the additional direct measurement of the choke current is performed does not need to meet stringent requirements. Instead, a high level of relative accuracy, that is to say a high level of accuracy with which the ratio of two choke currents is determined, is sufficient. It is then possible to determine an exact absolute value of the choke current with the aid of a single calibration process with an absolutely accurate current sensor. However, this sensor does not have to be a permanent constituent part of the device.

In the simplest case, the magnetic bias of the choke is ascertained from the measurement values of the magnetic flux density at a choke current of zero. At a choke current of zero, the magnetic field which is emitted by the choke, that is to say the magnetic stray field of the choke, is based solely on the magnetic bias of the choke. However, a choke current of zero cannot be set in order to monitor the magnetic bias during operation without problems during operation of a choke. This is the case, for example, when the choke is used in a DC/DC converter which is connected only to a small output capacitance or at the output end of a small capacitance of a DC intermediate circuit. In this case, even a brief change in the choke current leads to a significant and possibly intolerable change in the voltage of the output capacitance or of the DC intermediate circuit. Therefore, in one embodiment of the method according to the disclosure, the magnetic bias of the choke is ascertained from the measurement values of the magnetic flux density at two different choke currents which are in a known ratio in relation to one another. Even if the absolute magnitude of these different choke currents is not known, the choke current of zero can be extrapolated therefrom. Therefore, the magnetic bias of the choke can also be determined without approaching a choke current of zero. If, in contrast, the choke is used, for example, in a DC/DC converter which has a large capacitance at its output, brief production of a choke current of zero can be easily tolerated since a voltage fluctuation which is generated does not have much effect on the large output-end capacitance and is therefore negligible, but at least tolerable.

Both a choke current of zero and also different choke currents which are in a known ratio in relation to one another can be known not only by direct measurement of the choke currents but also on account of the known operating state of a device which produces the choke current, such as an inverter for example. In general, times at which the choke current is zero or different choke currents which are in a known ratio in relation to one another are present can be derived from conditions which are present during operation of the choke. Specifically, the choke can be used, for example, in the DC/DC converter, for example a step-up converter of an inverter, which is operated at least at times in an intermittent mode. It is further possible for a choke current of zero to be deliberately produced at selected times in the case of a DC/DC converter of the inverter. In particular, the inverter can indicate times at which the choke current is zero, or different times at which the produced choke currents are in a known ratio in relation to one another, in order to determine the magnetic bias of the choke from the flux densities, which are measured at those times, of the magnetic field which is produced by the choke. In the last case, the times are advantageously selected such that a time period between two times at which a measurement takes place and which are jointly used for determining the magnetic bias of the choke is as short as possible. In this way, the risk and the influence of a change in the magnetic bias between the two measurements, which change takes place in a potentially creeping and generally slow manner, are minimized.

In the case of the method according to one embodiment of the disclosure, the process of ascertaining the magnetic bias of the choke is repeated after defined events. Defined events of this kind can include the situation of a certain time having elapsed. However, the events can also include, for example, the application of high choke currents or highly fluctuating choke currents to the choke, the risk of a change in the source of the premagnetization of the choke being associated with the choke currents. The events after which the process of ascertaining the magnetic bias of the choke is repeated necessarily include any procedure with which the magnetic bias is modified, for example refreshed, in a deliberate manner. The magnetic bias which is determined last in each case is expediently used for determining the actual choke current from the measurements of the flux density taking into account the magnetic bias. It is likewise possible for the magnetic bias which is to be taken into account to be given by an average value or by an extrapolated value of a plurality of magnetic biases determined last.

The source of the magnetic bias of the choke can have one or more permanent magnets in the method according to the disclosure. In principle, the source of the premagnetization can, however, also be, for example, an additional winding of the coil through which a constant current flows, or the like.

In the method according to the disclosure, the flux density of the magnetic field which is emitted by the choke can be consecutively measured at a plurality of locations which are fixed in relation to the choke. The objective in this case may be more accurate ascertaining of the choke current and also of the magnetic bias of the choke, even when the magnetic bias is emitted only by a single source. If there are a plurality of sources for the magnetic bias, for example a plurality of permanent magnets, the sources can be monitored separately from one another by measuring the flux density of the magnetic field at a plurality of locations. Measurement of the flux density of the magnetic field at a plurality of locations is also expedient when the choke has a plurality of choke windings through which in each case (i.e., within one choke winding) one choke current flows (and therefore a plurality of choke currents may exist associated with a plurality of choke windings). The flux density at a suitable additional location should at least be measured for each of these choke currents in order to be able to detect the choke currents separately. In this case, the additional location is advantageously situated as close as possible to the respective sources of the magnetic bias or as close as possible to the winding ends of the choke windings, since the field strength of the relevant magnetic stray field is comparatively high there and therefore a signal-to-noise ratio which is as high as possible is ensured in the event of measurement.

In the method according to the disclosure, the temperature of a core of the choke and/or of a source of the magnetic bias of the choke and/or of a magnetic field sensor which is used to measure the magnetic flux density can be measured and taken into account when ascertaining the magnetic bias and/or the actual choke current from the actual measurement values of the flux density. Therefore, temperature-dependent effects can be compensated in the case of these components.

A device according to the disclosure comprises a choke with a source for a magnetic bias, comprises a magnetic field sensor which is arranged at a location which is fixed in relation to the choke and which consecutively measures a flux density of a magnetic field, which is emitted by the choke, at a sampling rate, and comprises an evaluation device which ascertains a magnetic bias of the choke from the measurement values of the magnetic flux density at a known choke current which occurs during operation of the choke. The choke current is known only in longer time intervals than the inverse value of the sampling rate during the measurement of the flux density, and the evaluation device determines the actual choke current from the actual measurement values of the flux density taking into account the ascertained magnetic bias.

The evaluation device can ascertain the magnetic bias of the choke from the measurement values of the flux density at the known choke current in time intervals which are longer by at least a factor of 10 than the time intervals in which it determines the choke current from the actual measurement values of the flux density taking into account the ascertained magnetic bias.

In one embodiment in order that a known choke current is available to the evaluation device, an additional current sensor which directly measures the choke current at a sampling rate which is lower by at least a factor of 10 than that of the magnetic field sensor and of which no particular requirements are made in respect of the absolute accuracy as long as it determines the choke current with a high degree of relative accuracy in comparison to another known choke current is provided. However, just like the method according to the disclosure, the device according to the disclosure is able to detect the actual choke current with a very high time resolution and a high degree of absolute accuracy. A maximum degree of accuracy is achieved with accurate calibration of the magnetic field sensor at the respective choke.

Instead of having an additional current sensor, the evaluation device can also receive a signal from the outside, the evaluation device ascertaining from the signal times at which the choke current is zero or different choke currents are in a known ratio in relation to one another. The evaluation device can receive signals of this kind, for example, from an inverter which produces the choke current.

Furthermore, the evaluation device can comprise an event detector and, when a prespecified event is detected, can repeat the process of ascertaining the bias of the choke. In this case, it is also considered to be part of the disclosure when the event is detected or else controlled by means of an external device, and this device indicates the event to the evaluation unit. An indication of this kind can be communicated—for example by cable or by radio—to the evaluation unit from the external device by means of a communication interface. In this case, it is sufficient when the evaluation unit has a corresponding receiving unit for receiving the communication signal. The events which are prespecified here have already been explained by way of example in connection with the method according to the disclosure.

The magnetic field sensor of the device according to the disclosure can be, in particular, a Hall sensor. A plurality of magnetic field sensors which consecutively measure the flux density of the magnetic field at a plurality of locations which are fixed in relation to the choke can also be provided.

The source for magnetic bias of the choke can comprise, in particular, a permanent magnet. A plurality of permanent magnets can also be present. Furthermore, the source for magnetic bias can also have a coil through which a fixed current flows, or the like.

The device according to the disclosure can comprise at least one temperature sensor which measures the temperature of a core of the choke and/or of the source of the magnetic bias and/or of the magnetic field sensor, and which is connected to the evaluation device. The evaluation device can take into account the temperature, which is measured by the temperature sensor, when ascertaining the magnetic bias and/or the actual choke current from the actual measurement values of the flux density.

Advantageous developments of the disclosure are set forth in the patent claims, the description and the drawings. The advantages of features and of combinations of a plurality of features mentioned in the description are purely exemplary and can take effect alternatively or cumulatively without the advantages necessarily needing to be achieved by embodiments according to the disclosure. Without the subject matter of the attached patent claims being altered hereby, the following applies as regards the disclosure content of the original application documents and the patent: further features can be gathered from the drawings—in particular the illustrated geometries and the relative dimensions of a plurality of components with respect to one another and the relative arrangement and operative connection thereof. The combination of features of different embodiments of the disclosure or of features of different patent claims is likewise possible as a deviation from the selected dependency references in the patent claims and is hereby suggested. This also relates to those features which are illustrated in separate drawings or are mentioned in the description thereof. These features can also be combined with features of different patent claims. Likewise, features mentioned in the patent claims can be dispensed with for further embodiments of the disclosure.

The features mentioned in the patent claims and the description should be understood with respect to their number such that precisely this number or a greater number than the mentioned number is provided without the explicit use of the adverb "at least" being necessary. If, therefore, an element is being discussed, for example, this should be understood as meaning that precisely one element, two elements or more elements are provided. These features can be supplemented by other features or be the only features from which the respective product consists.

The reference symbols contained in the patent claims in no way restrict the scope of the subjects protected by the patent claims. They merely serve the purpose of making the patent claims more easily understandable.

BRIEF DESCRIPTION OF THE DRAWINGS

The disclosure will be explained and described in greater detail below on the basis of exemplary embodiments with reference to the attached drawings.

DETAILED DESCRIPTION

The disclosure relates to a method for measuring a choke current through a choke, wherein a flux density of a magnetic field which is emitted by the choke is consecutively measured at a sampling rate at a location which is fixed in relation to the choke, and wherein the actual choke current is determined from the actual measurement values of the flux density. The present disclosure further relates to a device comprising a choke, comprising a magnetic field sensor which is arranged at a location which is fixed in relation to the choke and which consecutively measures a flux density of a magnetic field, which is emitted by the choke. The device further comprises an evaluation device which determines the actual choke current from the actual measurement values of the flux density.

The magnetic flux density B forms a relationship with the field strength H of the magnetic field at the same location by way of the equation $B=\mu^*\mu_0^*H$, where $\mu$ is the magnetic permeability of the material through which the magnetic field extends, and where $\mu_0$ is a constant. Therefore, it is also possible to base the method on the field strength of the magnetic field at the location which is fixed in relation to the choke as a measure of the flux density of the magnetic field. (In order to be able to deduce the magnetic field strength H at the same location with measurement using the Hall sensor (permeability $\mu=1$), it is advantageous to use the permeability of air ($\mu_{Air}=1+4^*10^{-7}$) and not the permeability of the Hall sensor material when recalculating the measured flux density B if the intention is to calculate the magnetic field strength H in air. This is based on the constancy of the normal component of B at the interface between two materials of different permeability.)

Figure 1:
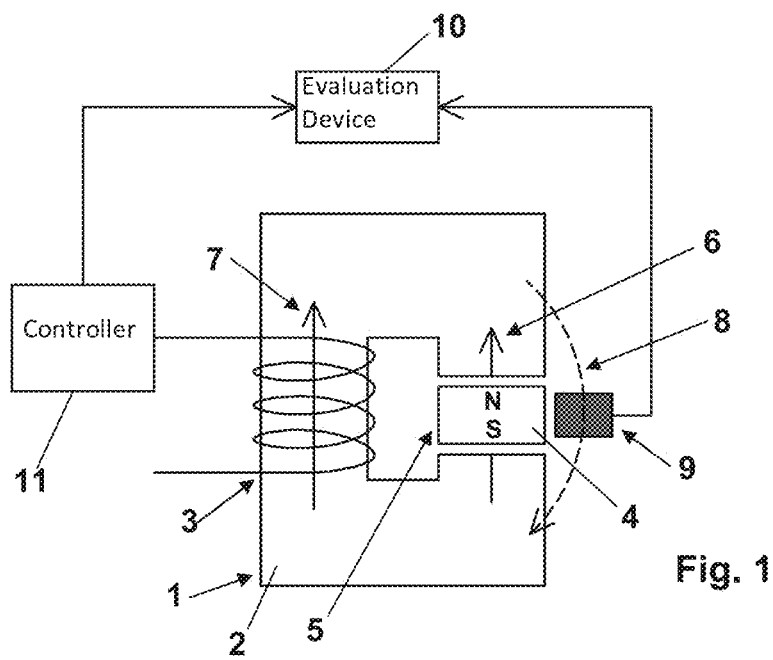
FIG. 1 illustrates a first embodiment of a device according to the disclosure.

FIG. 1 shows a choke 1 with a choke winding 3 which is provided on a core 2. The choke 1 is magnetically biased by a permanent magnet 4 which is arranged in an air gap 5 in the C-shaped core 2 and premagnetizes the core 2. The magnetic bias 6, which is indicated by an arrow, or premagnetization in this case opposes a magnetization 7 which is produced by a choke current which flows in a fixed direction being applied to the choke winding 3 and is likewise symbolized by an arrow. As a result, the effective operating range of the choke 1 before its core 2 is magnetically saturated is extended for the choke current which flows in a fixed direction.

The magnetic field 8 or stray field indicated by a dashed arrow next to the permanent magnet 4 and the air gap 5 is detected by a magnetic field sensor 9. The magnetic field sensor may be, in particular, a Hall sensor. The magnetic field sensor 9 measures, at a location which is fixed in relation to the choke 1, the flux density, which is locally given there, of the magnetic field 8 which is produced by the choke 1. This magnetic field 8 is based both on the magnetic bias 6 and on the magnetization 7 as a result of the choke current which flows through the choke winding 3. The flux densities which are consecutively measured by the magnetic field sensor 9 are evaluated by an evaluation device 10 both with respect to the magnetic bias 6 and also the actual choke current through the choke 3. In this case, either the measurement value of the flux density at a choke current of zero or measurement values which have been measured at different choke currents which are in a known ratio in relation to one another but do not have to be absolutely known is/are used in order to ascertain the magnetic bias 6. The evaluation device 10 receives or detects suitable times for recording the measurement values from a device 11 which produces the choke current through the choke winding 3.

It is known that any changes in temperature can have an influence on the magnetization 7 of the core 2, and also on the magnetic bias 6 of the choke 1. Temperature effects of this kind therefore also influence the magnetic field 8 which is emitted by the choke and the magnetic flux density of the magnetic field. In order to eliminate, but at least to minimize, a measurement error which is caused as a result when determining the choke current and also the magnetic bias 6 of the choke 1, the device comprises, in an advantageous refinement, one or more temperature sensors (not illustrated in FIG. 1) in the immediate vicinity of the magnetic field sensor 9, of the core 2 and/or of the source of the magnetic bias—here: the permanent magnet 4. The temperature sensor may also be in direct contact with these components. The output of the temperature sensor is connected to the evaluation device 10. Therefore, the evaluation device 10 is able to compensate a purely temperature-related change in a signal to the magnetic field sensor 9, that is to say the measurement signal. The accuracy of the measurement can be increased in this way.

Figure 2:
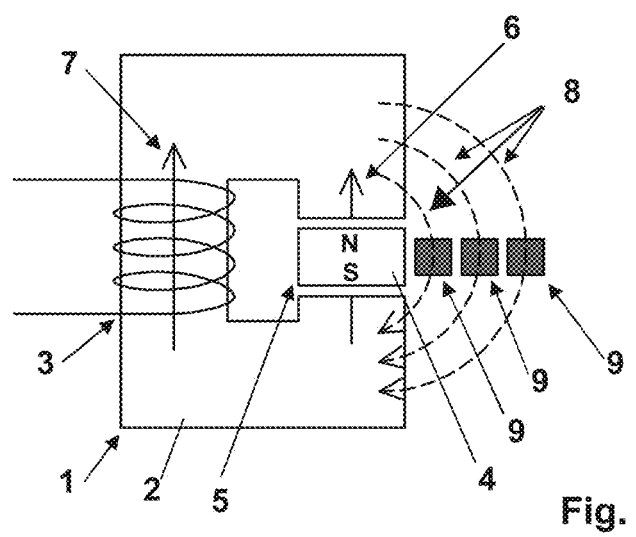
FIG. 2 illustrates a variant of the device according to FIG. 1.
Figure 3:
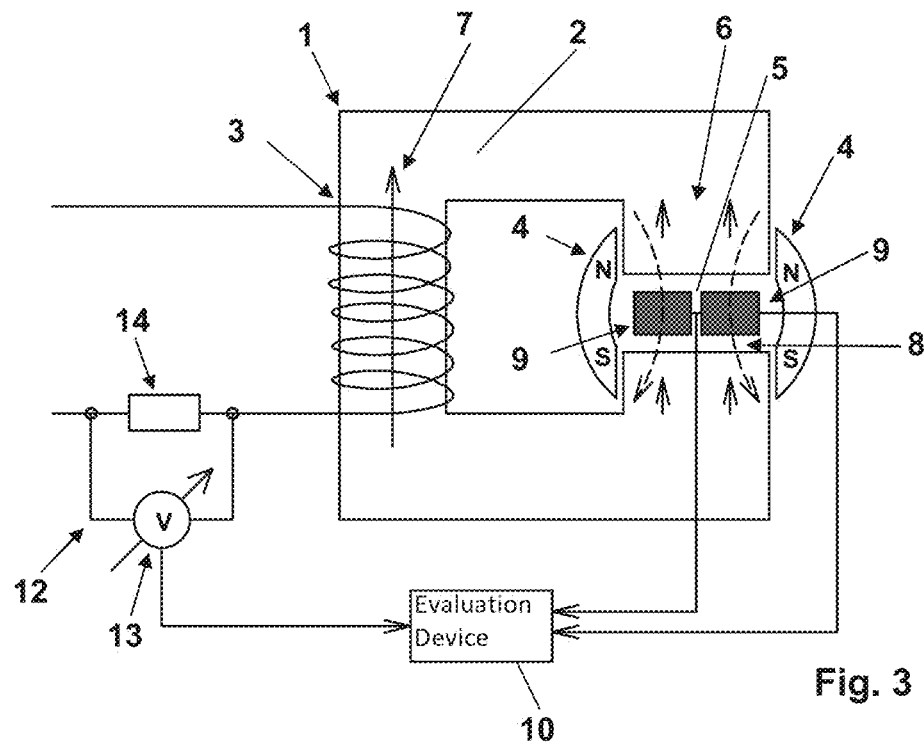
FIG. 3 illustrates a second embodiment of the device according to the disclosure.

In FIG. 1—and in FIG. 2 and FIG. 3—the permanent magnet 4 is not shown in direct contact with the core 2. Instead, gaps are shown between the permanent magnet 4 and the core 2. When the permanent magnet 4 remains fastened to the core 2—for example by an adhesive bonding process—the gaps between the two components also cannot be fully avoided for purely manufacturing reasons. For the purpose of fastening, the gaps can be filled, for example, with a magnetically inactive material, such as a suitable adhesive. Although gaps are shown between the permanent magnet 4 and the core 2 in each of FIGS. 1 to 3, the scope of the disclosure however also covers the situation of the permanent magnet 4 being inserted with an accurate fit—that is to say without resulting gaps—into the air gap 5 in the core 2.

FIG. 2 illustrates the choke 1, which is magnetically biased by the permanent magnet 4, together with a plurality of magnetic field sensors 9 which detect the magnetic flux density of the magnetic field 8 at different locations, that is to say in this case at different lateral distances from the air gap 5 and the permanent magnet 4 which is arranged therein. The measurement accuracy during detection of the magnetic bias 6 and also of the choke current through the choke winding 3 can be increased with the aid of the plurality of magnetic field sensors 9. In addition, it is possible to use an arrangement of a plurality of adjacent magnetic field sensors to identify measurements in the case of which—for whatever reason—external interference superimposes an additional magnetic field component on the magnetic field of the choke 1 which is actually of interest. This superimposition changes the relative ratio of the signal level of the various magnetic field sensors 9 and can therefore be identified.

The device shown in FIG. 3 has a choke 1 which is magnetically biased by two permanent magnets 4. In this case, the permanent magnets 4 are arranged in an arc on both sides of the air gap 5, while two magnetic field sensors 9 are situated in the air gap 5. The magnetic field sensors 9 detect the magnetic field 8 in the air gap 5. In this case, each of the magnetic field sensors 9 is associated with one of the permanent magnets 4, that is to say it detects the portion of the magnetic field 8 which is based on the magnetic bias 6 through the associated permanent magnet 4, with a greater degree of sensitivity. In addition to the flux densities which are detected by the magnetic field sensors 9, the evaluation device 10 takes into account the signal of a current sensor 12 which, using a voltmeter 13, detects the voltage which is dropped across a shunt resistor 14 on account of the choke current. The current sensor 12 is only required in order to detect relative magnitudes of the choke current at a few times. However, the evaluation device 10 calculates the choke current through the choke winding 3 consecutively and with a very high time and absolute resolution from the measurement values of the magnetic flux density which are consecutively detected by the magnetic field sensors 9. The evaluation device 10 is able to transmit the variables (choke current, magnetic bias) ascertained in this way to a further unit—for example to a superordinate control means of an inverter (not illustrated in FIG. 3).

Figure 4:
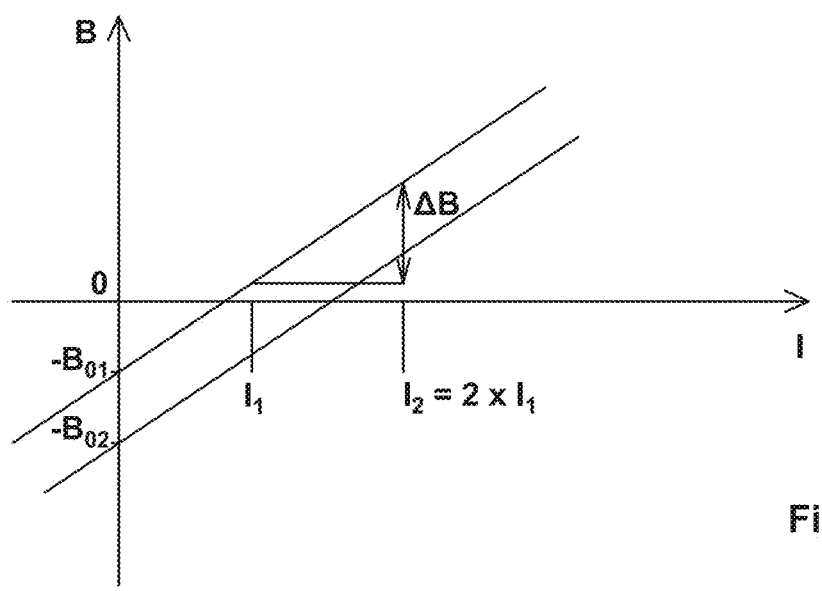
FIG. 4 is a graph illustrating measurement values of a magnetic flux density, which are measured in the case of the method according to the disclosure, with respect to the associated choke current.

FIG. 4 illustrates the magnetic flux density B which is measured at a fixed location relative to a magnetically biased choke by a magnetic field sensor as a function of the choke current I using a graph. The graph shows that the magnetic flux density B of the magnetic stray field which is produced by the magnetically biased choke depends firstly on the choke current I and secondly on the magnetic bias of the choke. Since the magnetic bias of the choke opposes a magnetization on account of the choke current I, the magnetic bias of the choke causes a negative offset in the magnetic field sensor. Therefore, the magnetic field sensor is used to measure a signal which represents a superposition of the two effects—magnetic bias of the choke and the magnetization of the choke which is produced solely by the choke current I.

In order to further explain the situation, a linear increase in the flux density together with the choke current I is assumed in FIG. 4. Experimental results show that a linear approach of this kind in an unsaturated core material of the choke over a comparatively wide measuring range of the choke current represents a sufficiently good approximation of the actual conditions. The figure shows two example profiles of the magnetic flux density B(I) for two different magnetic biases which, at a choke current I=0, lead to a negative flux density $B(I=0)=-B_{01}$ or $B(I=0)=-B_{02}$, that is to say to a magnetic flux with a direction opposite to the magnetic flux on account of the choke current I. In this case, the flux density $-B_{01}$ or $-B_{02}$ is a direct measure of the magnetic bias. In other words, the magnetic bias can be very easily determined when the choke current is I=0. However, it is often the case during operation of a premagnetized choke that a choke current of zero is not produced or the production of a choke current of zero, even briefly, cannot be tolerated for the reasons explained above. However, in this case, the magnetic bias can be ascertained by the magnetic flux density in the case of the choke current I=0 being extrapolated from the magnetic flux densities $B(I_1)$ and $B(I_2)$ at two choke currents $I_1$ and $I_2$ which are in a fixed ratio in relation to one another, without having to explicitly create the current-free state I=0. By way of example, it is possible to deduce, from the difference $\Delta B$ between the flux densities $B(I_1)$ and $B(I_2)$ at the choke current $I_1$ and a choke current $I_2$ which is twice as large, the flux density at the choke current of zero as follows:

$$B(I=0)=B(I_1)-\Delta B=B(I_1)-(B(I_2)-B(I_1))=2B(I_1)-B(I_2)$$

When the magnetic bias in the form of B(I=0) is known, it is possible to deduce I from the actual value of B(I). In this case, a calibration curve which is intended for the individual case can also be used instead of a linear relationship which is shown in FIG. 4. This equally applies for determining the premagnetization too.

The invention claimed is:

1. A method for measuring an actual choke current through a choke with a magnetic bias comprising:
   measuring a first flux density of a magnetic field which is emitted by the choke at a location which is fixed in relation to the choke, wherein the first flux density is measured at a first time instant when a known choke current is conducting through the choke, wherein the first flux density and the known choke current are used to ascertain the magnetic bias of the choke;
   measuring a second flux density of the magnetic field which is emitted by the choke at the location a plurality of times defined by a sampling rate; and
   determining the actual choke current using the second flux density and the ascertained magnetic bias.

2. The method of claim 1, further comprising:
   measuring the first flux density of the magnetic field at a second time instant when a known choke current is conducting through the choke, wherein a time difference between the first time instant and the second time instant when the choke current is known is larger than a time difference between neighboring samples of second flux density measurements.

3. The method as claimed in claim 2, wherein the time difference between the first and second time instants is longer by at least a factor of 10 than a time difference between neighboring samples in which the choke current is determined from measurement values of the second flux density using the ascertained magnetic bias.

4. The method as claimed in claim 2, wherein the known choke current is known by being directly measured at a sampling rate defined by the first and second time instants which is lower by at least a factor of 10 than the sampling rate during the measurement of the second flux density.

5. The method as claimed in claim 2, wherein the magnetic bias of the choke is ascertained using measurement values of the first flux density at a choke current of zero.

6. The method as claimed in claim 5, wherein the first and second time instants at which the known choke current is zero are derived from conditions which are present during operation of the choke.

7. The method as claimed in claim 2, wherein the magnetic bias of the choke is ascertained using measurement values of the first flux density at two different known choke currents which are in a known ratio in relation to one another.

8. The method as claimed in claim 7, wherein the first and second time instants at which the two different known choke currents which are in a known ratio in relation to one another are present are derived from conditions present during operation of the choke.

9. The method as claimed in claim 1, wherein ascertaining the magnetic bias of the choke is repeated after defined events.

10. The method as claimed in claim 1, wherein the first and/or second flux density of the magnetic field is consecutively measured at a plurality of locations which are fixed in relation to the choke.

11. The method as claimed in claim 1, further comprising:
measuring a temperature of a core of the choke and/or of a source of the magnetic bias of the choke and/or of a magnetic field sensor which is used to measure the first and/or second magnetic flux density; and
using the temperature when ascertaining the magnetic bias and/or the actual choke current from measurement values of the first and/or second flux density.

12. A device for measuring an actual choke current through a choke with a magnetic bias by:
measuring a first flux density of a magnetic field which is emitted by the choke at a location which is fixed in relation to the choke, wherein the first flux density is measured at a first time instant and at a second, different time instant when a known choke current is conducting through the choke, wherein in each of the first and second time instants the first flux density and the known choke current are used to ascertain the magnetic bias of the choke;
measuring a second flux density of the magnetic field which is emitted by the choke at the location a plurality of times defined by a sampling rate;
determining the actual choke current using the second flux density and the ascertained magnetic bias;
the device comprising:
the choke;
a magnetic field sensor arranged at the location, wherein the magnetic field sensor is configured to consecutively measure a flux density of a magnetic field which is emitted by the choke to obtain actual measurement values of the first flux density and the second flux density; and
an evaluation device configured to determine the actual choke current from the actual measurement values of the second flux density,
wherein the choke comprises a magnetic bias source, and
wherein the evaluation device is configured to ascertain the magnetic bias of the choke from measurement values of the first flux density at the known choke current which occurs during operation of the choke, wherein the first time instant and the second time instant, at which time instants the choke current is known, define a time interval therebetween that is longer than an inverse value of the sampling rate during the measurement of the second flux density, and
wherein the evaluation device is further configured to determine the actual choke current from the actual measurement values of the second flux density using the magnetic bias.

13. The device as claimed in claim 12, wherein the evaluation device is configured to ascertain the magnetic bias of the choke from the measurement values of the first flux density at the known choke current at the first and second time instants that define the time interval, and wherein that time interval is longer by at least a factor of 10 than time intervals defined by the sampling rate of the actual measurement values of the second flux density from which it determines the choke current using the ascertained magnetic bias.

14. The device as claimed in claim 12, further comprising a current sensor configured to directly measure a choke current to obtain the known choke current at a sampling rate defined by the first and second time instants which is lower by at least a factor of 10 than the sampling rate of the second flux density measurements.

15. The device as claimed in claim 12, wherein the evaluation device is configured to receive a signal and ascertain times at which the choke current is zero or different choke currents are in a known ratio in relation to one another from the signal.

16. The device as claimed in claim 12, wherein the evaluation device comprises an event detector and, when a prespecified event is detected by the event detector the evaluation device is configured to repeat a process of ascertaining the magnetic bias of the choke.

17. The device as claimed in claim 12, wherein the magnetic field sensor comprises a Hall sensor.

18. The device as claimed in claim 12, further comprising a plurality of magnetic field sensors configured to consecutively measure the flux density of the magnetic field at a plurality of different locations that are fixed in relation to the choke.

19. The device as claimed in claim 12, wherein the magnetic bias source comprises a permanent magnet.

20. The device as claimed in claim 12, further comprising at least one temperature sensor configured to measure the temperature of a core of the choke and/or of the magnetic bias source and/or of the magnetic field sensor, wherein the at least one temperature sensor is connected to the evaluation device, and wherein the evaluation device is configured to take into account the temperature, which is measured by the temperature sensor, when ascertaining the magnetic bias and/or the actual choke current from the actual measurement values of the flux density.

* * * * *